US007480153B2

(12) United States Patent
Kong

(10) Patent No.: US 7,480,153 B2
(45) Date of Patent: Jan. 20, 2009

(54) EMI SHIELDING PACKAGE AND METHOD FOR MAKING THE SAME

(75) Inventor: Xiao-Hua Kong, Shenzhen (CN)

(73) Assignees: Hong Fu Jin Precision Industry (Shenzhen) Co., Ltd., Shenzhen (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 320 days.

(21) Appl. No.: 11/322,870

(22) Filed: Dec. 30, 2005

(65) Prior Publication Data

US 2006/0221591 A1    Oct. 5, 2006

(30) Foreign Application Priority Data

Apr. 5, 2005   (CN) .................. 2005 1 0034037

(51) Int. Cl.
*H05K 9/00* (2006.01)
(52) U.S. Cl. .................. 361/818; 361/800; 361/816; 361/820; 361/821; 361/760
(58) Field of Classification Search .............. 361/818, 361/816, 821, 800, 760, 765, 748
See application file for complete search history.

(56) References Cited

U.S. PATENT DOCUMENTS

| 5,166,772 | A | | 11/1992 | Soldner et al. | |
|---|---|---|---|---|---|
| 6,072,243 | A | * | 6/2000 | Nakanishi | 257/783 |
| 6,617,683 | B2 | * | 9/2003 | Lebonheur et al. | 257/707 |
| 6,683,795 | B1 | * | 1/2004 | Yoo | 361/816 |
| 6,809,931 | B2 | * | 10/2004 | Dove et al. | 361/707 |
| 7,327,015 | B2 | * | 2/2008 | Yang et al. | 257/660 |
| 2002/0000649 | A1 | * | 1/2002 | Tilmans et al. | 257/678 |
| 2004/0055783 | A1 | * | 3/2004 | Masuda | 174/252 |

FOREIGN PATENT DOCUMENTS

TW          359063          5/1999

OTHER PUBLICATIONS

Fei Sha, "Section 4, Sheilding Enclosure", EMC Technology of Mechatronics System, May 1999, pp. 73-74, Chinapower Company, China.

* cited by examiner

*Primary Examiner*—Dean A. Reichard
*Assistant Examiner*—Hoa C Nguyen
(74) *Attorney, Agent, or Firm*—Morris Manning Martin LLP; Tim Tingkang Xia, Esq.

(57) ABSTRACT

An exemplary Electromagnetic Interference (EMI) shielding package (1) includes a substrate (10), a metal cap (15), and a potting compound (18). The substrate has a plurality of electronic components (11a, 11b, 12) fixed thereon. The metal cap includes a horizontal base panel (152) and a plurality of peripheral walls (151) vertical to the base panel. A related method for making the EMI shielding package includes: providing a substrate with a plurality of electronic components fixed thereon; providing a metal cap including a horizontal base panel and a plurality of peripheral walls vertical to the base panel; attaching the walls to the substrate, thereby covering selected one or more of the electronic components that need to be shielded with the metal cap; sealing the electronic components and the metal cap with a potting compound; and curing the potting compound to form an encapsulation.

13 Claims, 3 Drawing Sheets

EMI SHIELDING PACKAGE AND METHOD FOR MAKING THE SAME

BACKGROUND OF THE INVENTION

1. Field of the Invention

The present invention relates in general to an electronic package, such as that including a printed circuit board serving as a base, and to a method for making the electronic package.

2. Related Art

Radio frequency (RF) components are easily interfered with by electromagnetic interference (EMI). Therefore, it is necessary or desirable to provide EMI shielding for such components.

FIG. 6 illustrates a sectional view of a typical kind of EMI shielding package 1. The EMI shielding package 1 comprises a substrate 10, a plurality of electronic components 11a and 11b, a chip 12, a plurality of gold wires 13, a colloid 14, and a metal cap 15. The electronic components 11a, 11b and the chip 12 are fixed to the substrate 10 by solder, and the chip 12 is electrically connected to the substrate 10 via the gold wires 13. Because the electronic component 11b and the chip 12 are subject to interference from EMI, the electronic component 11b and the chip 12 are shielded in order to ensure normal operation. The electronic component 11a, such as an antenna, need not be shielded. The colloid 14 covers the chip 12 and the gold wires 13 and protects them from damage. Finally, the metal cap 15 is fixed to the substrate 10 by solder to thereby form the EMI shielding package 1.

FIG. 7 is a top view of the EMI shielding package 1. The metal cap 15 only shields the electronic component 11b and the chip 12, and does not shield the electronic component 11a.

Though the EMI shielding package 1 has an outer metal cap 15 for shielding the electronic components that are subject to interference from EMI, there are some disadvantages. Firstly, the exposed electronic component 11a is easily eroded. Secondly, the EMI shielding package 1 uses solder as a bonding agent. The solder is prone to melt at very high operating temperatures, and the molten solder may negatively impact the electronic components 11a and 11b attached to the substrate 10. Thirdly, due to the need to protect the chip 12 and the gold wires 13 with the colloid 14, the manufacturing process is complex and time consuming, which leads to higher costs.

Therefore, what is needed is to provide an EMI shielding package that has greater reliability and that can be produced at lower cost.

SUMMARY OF THE PRESENT EMBODIMENTS

An exemplary Electromagnetic Interference (EMI) shielding package comprises a substrate, a metal cap, and a potting compound. The substrate has a plurality of electronic components fixed thereon. The metal cap comprises a horizontal base panel, and a plurality of peripheral walls vertical to the base panel. The walls are attached to the substrate via at least one pad. Thereby, selected one or more of the electronic components that need to be shielded are covered by the metal cap. The potting compound seals the electronic components and the metal cap.

An exemplary method for making an EMI shielding package assembly comprises the steps of: (i) providing a substrate with a plurality of electronic components fixed thereon; (ii) providing a metal cap comprising a horizontal base panel and a plurality of peripheral walls vertical to the base panel; (iii) attaching the metal cap to the substrate, thereby covering selected one or more of the electronic components that need to be shielded with the metal cap; (iv) sealing the electronic components and the metal cap with a potting compound; and (v) curing the potting compound to form an encapsulation.

Other advantages and novel features will be drawn from the following detailed description of preferred embodiments of the present invention with the attached drawings, in which:

DETAILED DESCRIPTION OF THE PRESENT EMBODIMENTS

Figure 1:
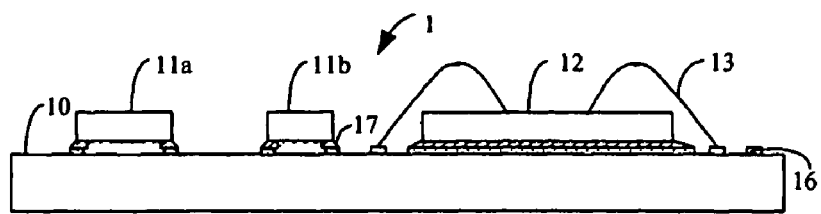
FIG. 1 is a sectional view of part of an electromagnetic interference (EMI) shielding package assembly in accordance with an exemplary embodiment of the present invention, showing a substrate and various electronic components fixed thereon.

FIG. 1 is a sectional view showing a substrate 10 employed in an electromagnetic interference (EMI) shielding package assembly 1 in accordance with an exemplary embodiment of the present invention. Electronic components 11a, 11b, and a chip 12 are fixed to pads (not labeled) with a bonding agent 17, and the pads are mounted on the substrate 10. In the exemplary embodiment, the bonding agent 17 may be solder or silver paste. The chip 12 is electrically connected to the substrate 10 through gold wires 13, which are attached by a wire bonding process. In other embodiments, the chip 12 is electrically connected to the substrate 10 by a flip chip (FC) mechanism. In the exemplary embodiment, some of the electronic components, such as the electronic component 11b and the chip 12, are subject to interference from EMI. Therefore, EMI shielding is needed to protect the electronic component 11b and the chip 12. Other electronic components, such as the electronic component 11a (e.g., an antenna), should not be shielded. Such other electronic components are left outside of the EMI shielding.

Figure 2:
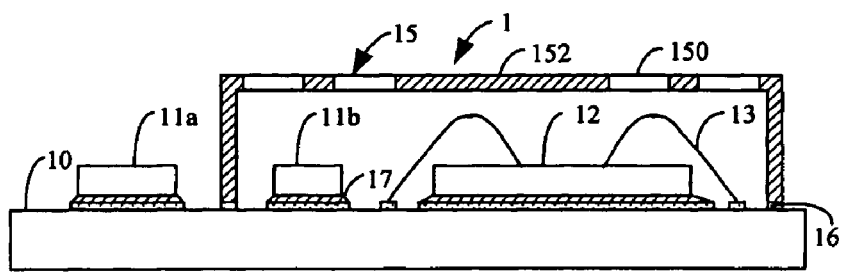
FIG. 2 is similar to FIG. 1, but showing a metal cap fixed on the substrate.
Figure 3:
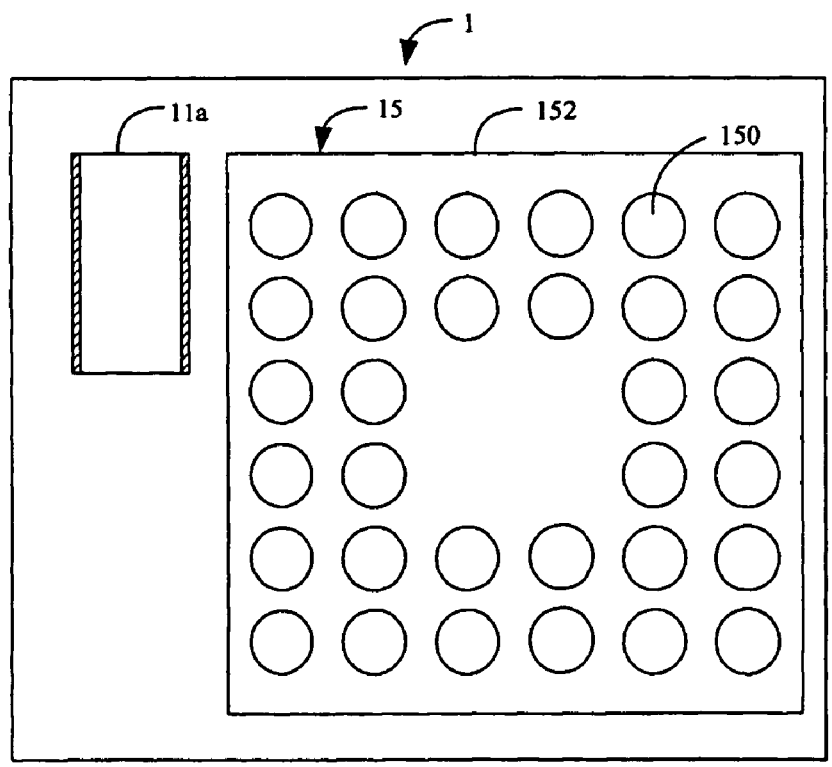
FIG. 3 is a top view of FIG. 2.
Figure 4:
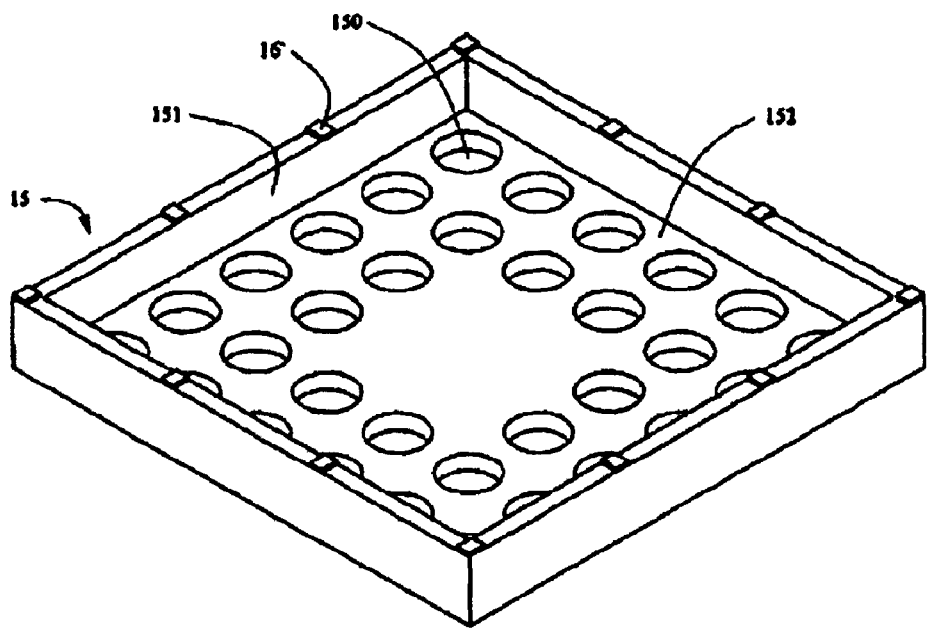
FIG. 4 is an enlarged, inverted, isometric view of the metal cap of FIG. 2.

FIG. 2 is a sectional view showing the substrate 10 with an EMI shielding means like a metal cap 15 of the EMI shielding package assembly 1 in accordance with the exemplary embodiment. FIG. 3 is a top view of FIG. 2, and FIG. 4 is an enlarged, inverted, isometric view of the metal cap 15. The metal cap 15 comprises a horizontal base panel 152 that defines a plurality of holes 150. The metal cap 15 further comprises a plurality of peripheral walls 151 vertical to the base panel 152. The walls 151 and the base panel 152 cooperatively define a space for accommodating the electronic component 11b and the chip 12. A plurality of pads 16' are mounted on bottom edges of the walls 151 and set in equal interval. In the exemplary embodiment, a width of the each pad 16' is substantially the same as a thickness of the each wall 151. The pads 16' are positioned to correspond with pads 16 on the substrate 10 around the electronic component 11b and the chip 12. The metal cap 15 is attached to the substrate 10 through the pads 16' and the pads 16. In order that the metal cap 15 can fully shield the electronic component 11b and the chip 12, a height of the walls 151 is higher than a maximum height of the electronic component 11b and the chip 12.

Figure 5:
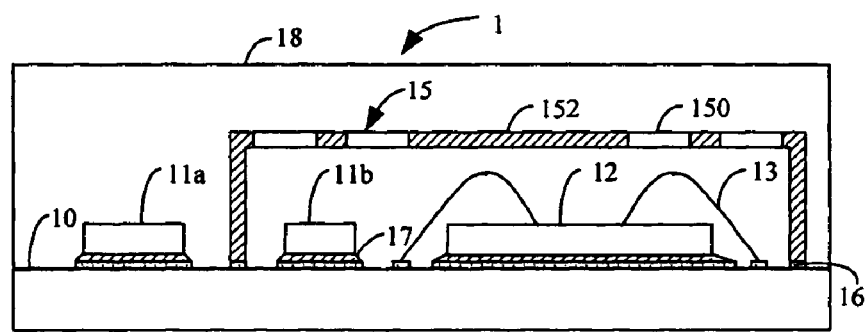
FIG. 5 is a sectional view of the complete EMI shielding package assembly in accordance with the exemplary embodiment.
Figure 6:
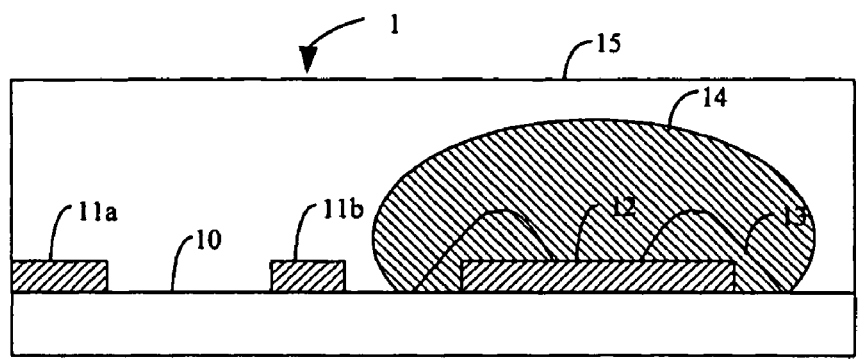
FIG. 6 is a sectional view of a conventional type of EMI shielding package.
Figure 7:
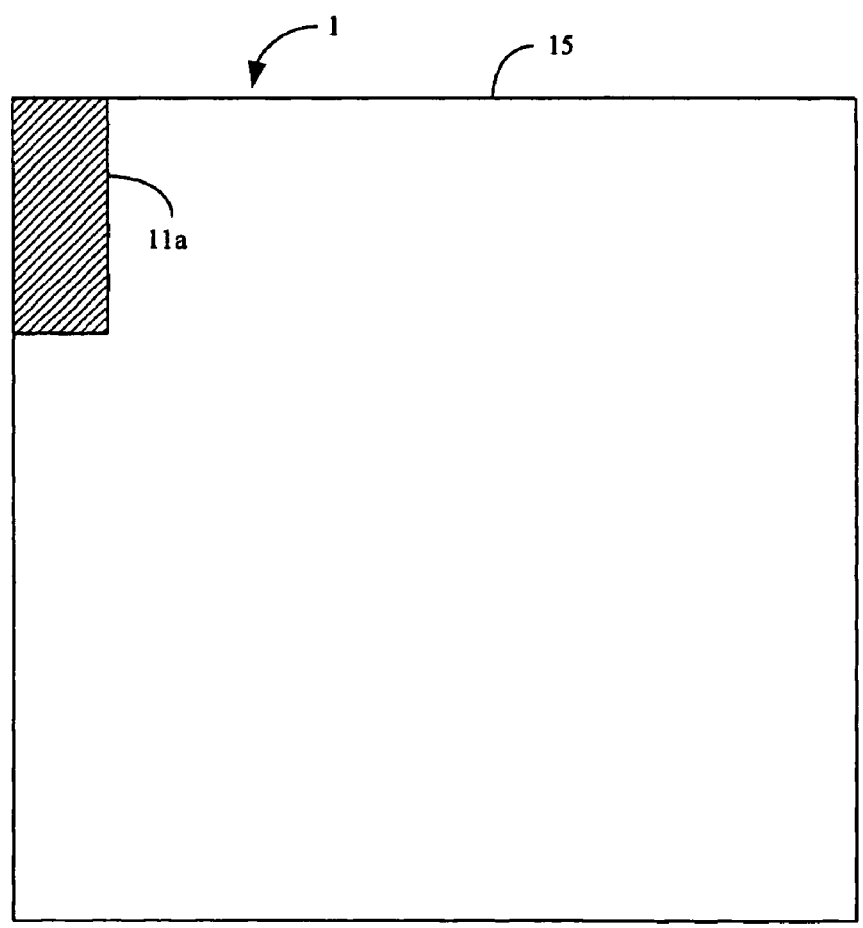
FIG. 7 is a top view of the shielding package of FIG. 6.

FIG. 5 is a sectional view of the complete EMI shielding package assembly 1. A molding process is performed after mounting of the metal cap 15 on the substrate 10. The metal cap 15 is filled with sealing material like a liquid potting compound 18 through the holes 150 thereof, and regions around an outside of the metal cap 15, the electronic component 11a and a top of the substrate 10 are also covered with the potting compound 18. That is, the potting compound 18 is used to seal all the components on the substrate 10, the metal cap 15, and gaps between the components and the substrate 10. In order to more quickly seal all the components under the metal cap 15 with the potting compound 18, allowing only minimum magnetic leakage, a diameter of the holes 150 of the metal cap 15 is calculated based on the following formula: $D \leq 1/20 * \lambda min$, wherein D represents the diameter of the holes 150, and $\lambda min$ represents the speed of light/the maximum frequency of EMI. In addition, the quantity of the holes 150 is calculated according to the following shielding efficiency equation: $SE=20 \lg(f/\sigma)-10 \lg n$; wherein SE represents the shielding efficiency; lg represents a common logarithm; f represents the maximum frequency of EMI; $\sigma$ represents the conductivity of the material of the metal cap 15; and n represents the quantity of holes 150.

In the exemplary embodiment, in order to ensure that the substrate 10 and the potting compound 18 are joined completely, plasma cleaning is performed before mounting of the metal cap 15 on the substrate 10. The plasma cleaning effectively removes organic matter from the substrate 10. Because the potting compound 18 seals all the components mounted on the substrate 10, the EMI shielding package assembly 1 not only uses the metal cap 15 to protect the electronic component 11b and the chip 12 from EMI, but also uses the potting compound 18 to prevent the electronic component 11a from being exposed to the air and eroding. In the exemplary embodiment, because a melting point of the potting compound 18 is lower than that of the bonding agent 17, in the process of applying the liquid potting compound 18, the bonding agent 17 remains in a solid state. Thus, the electronic components 11a, 11b, and the chip 12 are not displaced by the application of the potting compound 18. Furthermore, in the exemplary embodiment, the molding process of the EMI shielding package assembly 1 is simple.

An exemplary method for making an EMI shielding package assembly comprises the steps of: (i) providing a substrate 10 with a plurality of electronic components 11a, 11b, 12 fixed thereon; (ii) providing a metal cap 15 comprising a horizontal base panel 152 and a plurality of peripheral walls 151 vertical to the base panel 152; (iii) attaching the metal cap 15 to the substrate 10, thereby covering selected one or more of the electronic components that need to be shielded with the metal cap 15; (iv) sealing the electronic components and the metal cap 15 with a potting compound 18; and (v) curing the potting compound 18 to form an encapsulation.

While particular embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

I claim:

1. An Electromagnetic Interference (EMI) shielding package assembly comprising:

a substrate with a plurality of electronic components fixed thereon;

a metal cap comprising a base panel and a plurality of walls extending from the base panel, the walls attaching to the substrate via at least one pad, wherein the metal cap covers selected one or more of the electronic components for shielding; and a potting compound sealing the electronic components and the metal cap;

wherein the base panel of the metal cap defines a plurality of holes, and a diameter of the holes is calculated based on the following formula: $D \leq 1/20 * \lambda min$, wherein D represents the diameter of the holes, and $\lambda min$ represents the speed of light/maximum frequency of EMI.

2. The EMI shielding package assembly as recited in claim 1, wherein the potting compound seals gaps between the electronic components and the substrate.

3. The EMI shielding package assembly as recited in claim 1, wherein a quantity of the holes is calculated according to the following shielding efficiency equation: $SE=20 \lg(f/\sigma)-10 \lg n$, wherein SE represents the shielding efficiency, lg represents a common logarithm, f represents the maximum frequency of EMI, $\sigma$ represents the conductivity of the material of the metal cap, and n represents the quantity of the holes.

4. The EMI shielding package assembly as recited in claim 1, wherein a height of the walls is greater than a maximum height of the electronic components shielded by the metal cap.

5. An electronic component package assembly, comprising:

a substrate of said electronic component package assembly;

a plurality of electronic components installable on said substrate;

an Electronmagnetic Interference (EMI) shielding means configured to cover at last one electronic component out of said plurality of electronic components, at least one accessible hole formed through said EMI shielding means so as spatially communicate covered space between said EMI shielding means and said substrate with space outside EMI shielding means; and sealing material applied to seal said plurality of electronic components and said EMI shielding means, and applied to seal said at least one component in said EMI shielding means via passage of said sealing material into said covered space of space of said EMI shielding means through said at least one accessible hole;

wherein a diameter of said at least one accessible hole is calculated based on the following formula: $D \leq 1/20 * \lambda min$; wherein D represents said diameter of said at least one accessible hole, and $\lambda min$ represents the speed of light/maximum frequency shielding by said EMI shielding means.

6. The electronic component package assembly as recited in claim 5, wherein said EMI shielding means is attached to said substrate via at least one pad.

7. The electronic component package assembly as recited in claim 5, wherein a quantity of said at least one accessible hole is calculated according to the following shielding efficiency equation: $SE=20 \lg(f/\sigma)-10 \lg n$; wherein SE represents shielding efficiency of said EMI shielding means, lg represents a common logarithm, f represents a maximum frequency shielding by said EMI shielding means, and n represents said quantity of said at least one accessible hole.

8. The electronic component package assembly as recited in claim 5, wherein said sealing material is applied to seal gaps between said plurality of electronic components and said substrate.

9. An Electromagnetic Interference (EMI) shielding package assembly comprising:
   a substrate with a plurality of electronic components fixed thereon;
   a metal cap comprising a base panel and a plurality of walls extending from the base panel, the walls attaching to the substrate via a plurality of pads, wherein the metal cap covers selected one or more of the electronic components for shielding; and
   a potting compound sealing the electronic components and the metal cap; wherein the pads are mount on bottom edges of the walls and set in equal interval, and wherein the base panel of the metal cap defines a plurality of holes, and a diameter of the holes is calculated based on the following formula: $D \leqq 1/20 * \lambda min$, wherein D represents the diameter of the holes, and $\lambda min$ represents the speed of light/maximum frequency of EMI.

10. The EMI shielding package assembly as recited in claim 9, wherein a quantity of the holes is calculated according to the following shielding efficiency equation: $SE=20 lg(f/\sigma)-101 gn$, wherein SE represents the shielding efficiency, lg represents a common logarithm, f represents the maximum frequency of EMI, $\sigma$ represents the conductivity of the material of the metal cap, and n represents the quantity of the holes.

11. The EMI shielding package assembly as recited in claim 9, wherein a width of the each pad is substantially the same as a thickness of the each wall.

12. The EMI shielding package assembly as recited in claim 9, wherein a height of the walls is greater than a maximum height of the electronic components shielded by the metal cap.

13. The EMI shielding package assembly as recited in claim 9, wherein the potting compound seals gaps between the electronic components and the substrate.

* * * * *